(12) United States Patent
Wei et al.

(10) Patent No.: US 9,619,063 B2
(45) Date of Patent: Apr. 11, 2017

(54) ARRAY SUBSTRATE AND MANUFACTURING METHOD THEREOF, AND TOUCH DISPLAY DEVICE

(71) Applicants: BOE TECHNOLOGY GROUP CO., LTD., Beijing (CN); Ordos Yuansheng Optoelectronics Co., Ltd., Inner Mongolia (CN)

(72) Inventors: Xiangdong Wei, Beijing (CN); Xueguang Hao, Beijing (CN); Cheng Li, Beijing (CN); Seongjun An, Beijing (CN); Bongyeol Ryu, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 64 days.

(21) Appl. No.: 14/415,373

(22) PCT Filed: Apr. 25, 2014

(86) PCT No.: PCT/CN2014/076244
§ 371 (c)(1),
(2) Date: Jan. 16, 2015

(87) PCT Pub. No.: WO2015/096328
PCT Pub. Date: Jul. 2, 2015

(65) Prior Publication Data
US 2016/0018935 A1    Jan. 21, 2016

(30) Foreign Application Priority Data
Dec. 23, 2013  (CN) .......................... 2013 1 0718479

(51) Int. Cl.
*G06F 3/041*     (2006.01)
*G06F 3/044*     (2006.01)
(Continued)

(52) U.S. Cl.
CPC ............ *G06F 3/0412* (2013.01); *G06F 3/044* (2013.01); *H01L 27/124* (2013.01);
(Continued)

(58) Field of Classification Search
CPC ...... G06F 3/0412; G06F 3/044; G06F 3/0416; G06F 2203/04103; G06F 3/0488; G06F 3/041; G02F 1/13338; G02F 2201/121
See application file for complete search history.

(56) References Cited

U.S. PATENT DOCUMENTS

| | | | |
|---|---|---|---|
| 2002/0089616 | A1 | 7/2002 | Hashimoto et al. |
| 2010/0171131 | A1 | 7/2010 | Iki |

(Continued)

FOREIGN PATENT DOCUMENTS

| | | |
|---|---|---|
| CN | 1338658 A | 3/2002 |
| CN | 101285975 A | 10/2008 |

(Continued)

OTHER PUBLICATIONS

First Office Action and English Translation from CN201310718479.8 dated Feb. 24, 2016.
(Continued)

*Primary Examiner* — Sanjiv D Patel
(74) *Attorney, Agent, or Firm* — Nath, Goldberg & Meyer; Joshua B. Goldberg

(57) ABSTRACT

Embodiments of the present invention provide an array substrate and a manufacturing method thereof and a touch display device. The array substrate comprises multiple data lines, multiple gate lines and multiple thin film transistors. The data lines and the gate lines intersect with each other in different planes to divide the array substrate into multiple pixel units, in each of which a thin film transistor is provided, wherein the array substrate further comprises multiple first touch sensing electrodes and multiple second touch sensing electrodes. The first touch sensing electrodes are provided below active regions of the thin film transistors and also serve as metal shielding layers for blocking light emitted by a backlight source. The first touch sensing electrodes and the second touch sensing electrodes intersect
(Continued)

with each other in different planes, and capacitances are formed at intersections of the first touch sensing electrodes and the second touch sensing electrodes.

12 Claims, 4 Drawing Sheets

(51) Int. Cl.
    *H01L 27/12*     (2006.01)
    *H01L 29/66*     (2006.01)
    *H01L 29/786*     (2006.01)

(52) U.S. Cl.
    CPC ...... *H01L 27/1218* (2013.01); *H01L 27/1222* (2013.01); *H01L 27/1248* (2013.01); *H01L 27/1259* (2013.01); *H01L 29/66757* (2013.01); *H01L 29/78675* (2013.01); *G06F 2203/04103* (2013.01); *G06F 2203/04107* (2013.01)

(56) References Cited

U.S. PATENT DOCUMENTS

| | | | | |
|---|---|---|---|---|
| 2011/0037747 | A1* | 2/2011 | Lee | G09G 3/3655 345/211 |
| 2012/0068944 | A1* | 3/2012 | Oh | G02F 1/13338 345/173 |
| 2012/0105347 | A1* | 5/2012 | Pak | G06F 3/0412 345/173 |
| 2012/0249436 | A1* | 10/2012 | Choi | G02F 1/13338 345/173 |
| 2012/0306797 | A1* | 12/2012 | Misaki | G06F 3/0412 345/173 |
| 2013/0021544 | A1* | 1/2013 | Fukuyama | G02F 1/13338 349/12 |
| 2013/0187162 | A1* | 7/2013 | Miwa | H01L 29/66757 257/57 |
| 2013/0229591 | A1* | 9/2013 | Kong | G02F 1/136209 349/46 |
| 2014/0362031 | A1* | 12/2014 | Mo | G09G 3/36 345/174 |
| 2015/0002752 | A1* | 1/2015 | Shepelev | G06F 3/044 349/12 |

FOREIGN PATENT DOCUMENTS

| | | |
|---|---|---|
| CN | 101943814 A | 1/2011 |
| CN | 102411240 A | 4/2012 |
| CN | 102822777 A | 12/2012 |
| CN | 102955636 A | 3/2013 |
| CN | 103713792 A | 4/2014 |

OTHER PUBLICATIONS

International Search Report for International Application No. PCT/CN2014/076244.

* cited by examiner

ARRAY SUBSTRATE AND MANUFACTURING METHOD THEREOF, AND TOUCH DISPLAY DEVICE

This is a National Phase Application filed under 35 U.S.C. 371 as a national stage of PCT/CN2014/076244, filed Apr. 25, 2014, an application claiming the benefit under 35 USC 119 of Chinese Application No. 201310718479.8, filed Dec. 23, 2013, the content of each of which is hereby incorporated by reference in its entirety.

FIELD OF THE INVENTION

The present invention relates to the field of display technology, and particularly to an array substrate and a manufacturing method thereof, and a touch display device.

BACKGROUND OF THE INVENTION

According to structures, touch panels can be classified into Add on Mode Touch Panels, On Cell Touch Panels and In Cell Touch Panels. For an in-cell touch panel, touch electrode of the touch panel is provided inside a liquid crystal display screen, so that the overall thickness of a module can be reduced, and the manufacture cost of the touch panel can also be greatly lowered. According to working principles, touch panels can be classified into resistive touch panels, capacitive touch panels, etc. A capacitive touch panel supports multi-point touch function, and has relatively high transmittance, relatively low overall power consumption, high hardness of contact surface and long service life.

At present, an existing capacitive in-cell touch panel is realized by directly adding touch scanning lines and touch sensing lines on an existing array substrate, that is, two layers of strip-shaped electrodes intersecting with each other in different planes are fabricated on a surface of the array substrate, the two layers of electrodes serve as touch driving lines and the touch sensing lines of the touch panel, respectively, and mutual capacitance is formed at a position where two electrodes intersect with each other in different planes. The working process of the touch panel is as follows: when touch driving signals are applied to the electrodes serving as the touch driving lines, voltage signals coupled to the touch sensing lines by the mutual capacitances are detected, during this process, when a human body contacts with the touch panel, the electric field of the human body will act on the mutual capacitance, so that the value of the mutual capacitance is changed, and the voltage signals coupled to the touch sensing lines are thus changed. As a result, the position of a contact point can be determined according to the change of the voltage signals.

In the above structure design of the capacitive in-cell touch panel, as touch scanning lines and touch sensing lines need to be provided additionally on an existing array substrate, the number of masking times in a manufacturing process will be increased, the thickness of the touch panel is also increased and the manufacture cost is thus increased. Moreover, the touch driving signals applied to the added touch scanning lines may interfere with the original display signals in the array substrate, so that the quality of displayed pictures and the accuracy of touch control are influenced.

Therefore, how to reduce the number of masking times in a manufacturing process, reduce the thickness of a touch panel and avoid the mutual interference between touch driving signals and display signals is the technical problem to be solved by those skilled in the art.

SUMMARY OF THE INVENTION

An object of embodiments of the present invention is to provide an array substrate and a manufacturing method thereof, and a touch display device including the array substrate. The array substrate has a simple structure, thus the touch panel has a relatively small thickness.

To achieve the above object, as one aspect of the embodiments of the present invention, there is provided an array substrate, which comprises a plurality of data lines, a plurality of gate lines and a plurality of thin film transistors, the plurality of data lines and the plurality of gate lines intersect with each other in different planes to divide the array substrate divided into a plurality of pixel units, in each of which the thin film transistor is provided, wherein the array substrate further includes a plurality of first touch sensing electrodes and a plurality of second touch sensing electrodes, the first touch sensing electrodes are provided below active regions of the thin film transistors and also serve as a metal shielding layer for blocking light emitted by a backlight source, the first touch sensing electrodes and the second touch sensing electrodes intersect with each other in different planes, and capacitances are formed at intersections of the first touch sensing electrodes and the second touch sensing electrodes.

For example, a common gate line is provided between every two adjacent gate lines to receive a common signal, at least a part of the common gate line corresponds to a drain of the thin film transistor and the first touch sensing electrode, so that a first storage capacitance is formed between the common gate line and the drain of the thin film transistor, and a second storage capacitance is formed between the common gate line and the first touch sensing electrode.

For example, material of the active layers of the thin film transistors includes low-temperature polycrystalline silicon; and the array substrate further includes a buffer layer, the active layers of the thin film transistors are provided on an upper surface of the buffer layer, the first touch sensing electrodes are provided on a lower surface of the buffer layer, and the second touch sensing electrodes are provided above the buffer layer.

For example, in each of the pixel units, the active layer of the thin film transistor is connected to the corresponding first touch sensing electrode through a first via hole penetrating through the buffer layer.

For example, the array substrate includes a gate insulating layer, an intermediate insulating layer, a planarization layer and a passivation layer, wherein the gate insulating layer covers the active layers of the thin film transistors, the gate lines and the common gate lines are provided on an upper surface of the gate insulating layer, the intermediate insulating layer covers the gate lines and the common gate lines, the sources and drains of the thin film transistors are provided on an upper surface of the intermediate insulating layer, the planarization layer covers the sources and drains of the thin film transistors, the second touch sensing electrodes are provided above the planarization layer, the passivation layer covers the common electrodes, and pixel electrodes of the array substrate are provided on an upper surface of the passivation layer, both the sources and drains of the thin film transistors are connected to the active layers of the thin film transistors through second via holes penetrating through the intermediate insulating layer and the gate insulating layer, and the pixel electrodes are connected to the drains of the thin film transistors through third via holes penetrating through the passivation layer and the planarization layer.

For example, the first touch sensing electrodes are touch detecting electrodes, while the second touch sensing electrodes are touch driving electrodes.

For example, a first floating electrode is provided between every two adjacent first touch sensing electrodes.

For example, the second touch sensing electrodes also serve as common electrodes of the array substrate.

For example, a second floating electrode is provided between every two adjacent second touch sensing electrodes.

As another aspect of the embodiments of the present invention, there is provided a touch display device, which comprises an array substrate, a touch driving circuit and a touch control circuit, wherein the array substrate is the above array substrate provided by the embodiment of the present invention; the first touch sensing electrodes and the second touch sensing electrodes are connected to the touch driving circuit and the touch control circuit, respectively; the touch driving circuit is configured to provide a touch driving signal to one of the first touch sensing electrodes and the second touch sensing electrodes in a touch time, and when a touch operation is performed, the touch driving signal is coupled to the other of the first touch sensing electrodes and the second touch sensing electrodes so as to form a position sensing signal, and the position sensing signal is output to the touch control circuit.

For example, the touch display device further includes a display driving circuit, to which the gate lines and the data lines are connected, respectively, and the display driving circuit is configured to output a scanning signal to the gate lines and provide a gray scale signal to the data lines in a display time.

For example, a first floating electrode connected to the touch driving circuit is provided between every two adjacent first touch sensing electrodes, wherein in the touch time, the touch driving circuit outputs an electrical signal same as a common signal to the first floating electrode; and in the display time, the first floating electrode floats.

For example, a second floating electrode connected to the touch driving circuit is provided between every two adjacent second touch sensing electrodes, wherein in the touch time, the touch driving circuit outputs an electrical signal same as the common signal to the second floating electrode; and in the display time, the second floating electrode floats.

As a further aspect of the embodiments of the present invention, there is provided a manufacturing method of an array substrate, which includes steps of: forming a first group of patterns, which includes first touch sensing electrodes; forming a second group of patterns, which includes active layers of thin film transistors, the active regions of the active layers being located above the first touch sensing electrodes so that the first touch sensing electrodes also serve as metal shielding layers for blocking light emitted by a backlight source; forming a third group of patterns, which includes the gate lines and gates of the thin film transistors; forming a fourth group of patterns, which includes data lines and sources and drains of the thin film transistors; and forming a fifth group of patterns, which includes second touch sensing electrodes, wherein the second touch sensing electrodes and the first touch sensing electrodes intersect with each other in different planes, and capacitances are formed at intersections of the first touch sensing electrodes and the second touch sensing electrodes.

For example, the third group of patterns further includes a common gate line located between every two adjacent gate lines, the common gate line is used for receiving a common signal, and at least a part of the common gate line corresponds to the drain of the thin film transistor and the first touch sensing electrode, so that a first storage capacitance is formed between the common gate line and the drain of the thin film transistor, and a second storage capacitance is formed between the common gate line and the first touch sensing electrode.

For example, the material for forming the second group of patterns comprises low-temperature polycrystalline silicon; and the manufacturing method further includes a step of forming a buffer layer between the step of forming a first group of patterns and the step of forming a second group of patterns, so that the active layers of the thin film transistors are provided on an upper surface of the buffer layer, and the first touch sensing electrodes are provided on a lower surface of the buffer layer.

For example, the manufacturing method, between the step of forming a first group of patterns and the step of forming a second group of patterns, further includes steps of: forming first via holes penetrating through the buffer layer; and then, in the step of forming a second group of patterns, filling the first via holes so that the active layers are connected to the respective first touch sensing electrodes through the first via holes.

For example, the first group of patterns further includes a first floating electrode between every two adjacent first touch sensing electrodes.

For example, the second touch sensing electrodes also serve as common electrodes of the array substrate.

For example, the fifth group of patterns further includes a second floating electrode between every two adjacent second touch sensing electrodes.

For example, the manufacturing method further includes steps of: forming a gate insulating layer between the step of forming a second group of patterns and the step of forming a third group of patterns, so that the gate lines and the common gate lines are provided on an upper surface of the gate insulating layer; forming an intermediate insulating layer and second via holes penetrating through the gate insulating layer and the intermediate insulating layer between the step of forming a third group of patterns and the step of forming a fourth group of patterns, so that the sources and drains of the thin film transistors are located on an upper surface of the intermediate insulating layer, and the sources and drains of the thin film transistors are connected to the respective active layers through the second via holes; forming a planarization layer between the step of forming a fourth group of patterns and the step of forming a fifth group of patterns, so that the planarization layer covers the sources and drains of the thin film transistors, and the second touch sensing electrodes are provided above the planarization layer; forming a passivation layer after the step of forming a fifth group of patterns, so that the passivation layer covers the common electrodes; forming third via holes penetrating through the passivation layer; and forming patterns including pixel electrodes, so that the pixel electrodes are connected to the drains of the respective thin film transistors through the third via holes.

In the embodiments of the present invention, the first touch sensing electrodes also serve as the shielding metal for the thin film transistors, so that the structure of the array substrate is simplified, the array substrate has a relatively small thickness, and the display panel using the array substrate has a relatively small thickness. Moreover, the array substrate provided by the embodiments of the present invention reduces the number of masks during manufacturing and simplifies the manufacturing procedure of an array substrate.

BRIEF DESCRIPTION OF THE DRAWINGS

The accompanying drawings, which constitute a part of the specification, are used for providing further understanding of the embodiments of the present invention, and are used for explaining the embodiments of the present invention together with the following specific implementations, but are not intended to limit the present invention. In the accompanying drawings.

DESCRIPTION OF THE PREFERRED EMBODIMENT

The specific implementations of the present invention will be described below in details in conjunction with the accompanying drawings. It should be understood that the specific implementations described herein are used for describing and explaining the present invention, rather than limiting the present invention.

Figure 1:
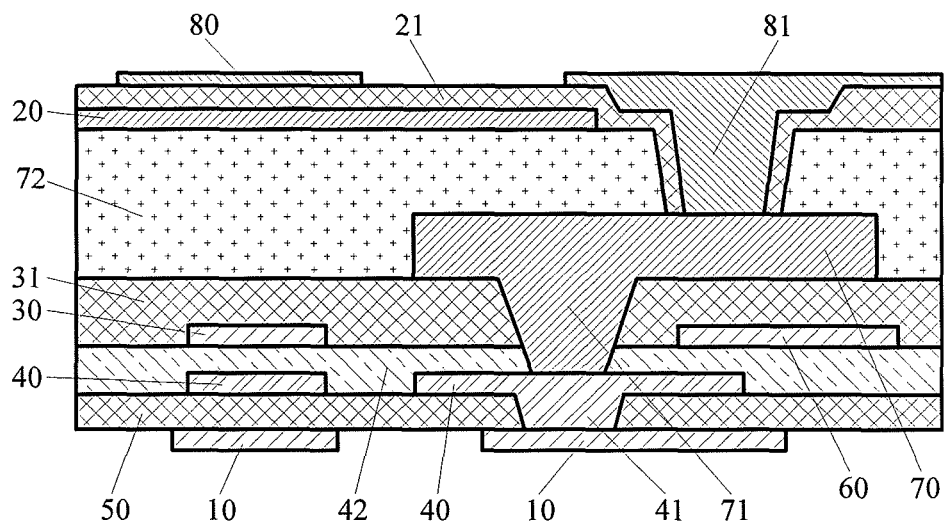
FIG. 1 is a cross-sectional view of an array substrate provided by an embodiment of the present invention.
Figure 2:
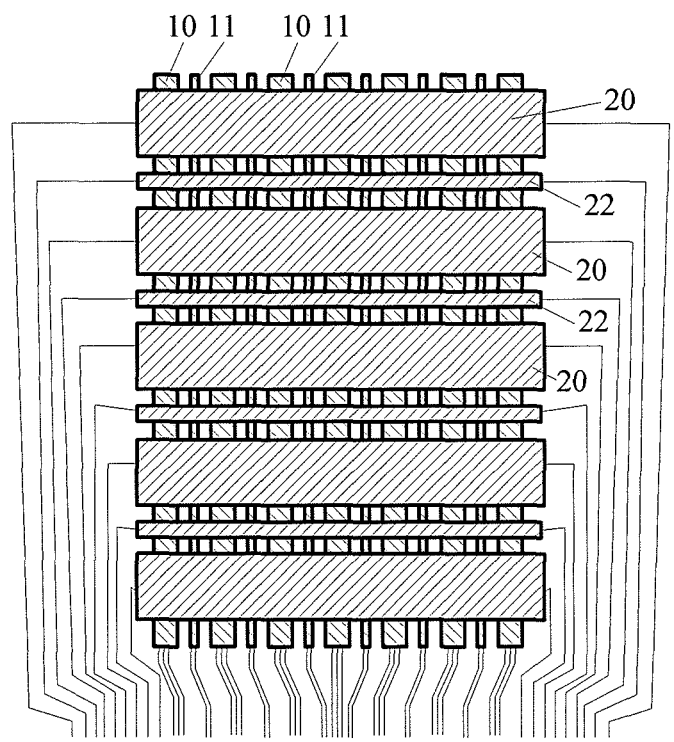
FIG. 2 is a circuit diagram of first touch sensing electrodes and second touch sensing electrodes in an array substrate provided by an embodiment of the present invention.

As shown in FIGS. 1 and 2, as one aspect of the embodiments of the present invention, there is provided an array substrate comprising a plurality of data lines, a plurality of gate lines 30 and a plurality of thin film transistors. The plurality of data lines and the plurality of gate lines 30 intersect with each other in different planes to divide the array substrate into a plurality of pixel units, the thin film transistor is provided in each pixel unit. The array substrate further comprises a plurality of first touch sensing electrodes 10 and a plurality of second touch sensing electrodes 20. The first touch sensing electrodes 10 are provided below channels (also referred to as active regions) of active layers 40 of the thin film transistors, and serve as metal shielding layers for blocking light emitted from a backlight source. The first touch sensing electrodes 10 and the second touch sensing electrodes 20 intersect with each other in different planes (as shown in FIG. 2), and capacitances are formed at the intersections of the first touch sensing electrodes 10 and the second touch sensing electrodes 20.

As the first touch sensing electrodes 10 may block light emitted by the backlight source and prevents the light from influencing photon-generated carriers of the active regions of the thin film transistors, the first touch sensing electrodes 10 may also serve as metal shielding layers of the thin film transistors.

In other words, in the embodiments of the present invention, as the first touch sensing electrodes 10 are shared as the metal shielding layers of the thin film transistors, the structure of the array substrate is simplified, so that the array substrate has a smaller thickness and thus the display panel using the array substrate has a smaller thickness. Moreover, the embodiments of the present invention can reduce the number of masks required in manufacturing the array substrate, and simplify the manufacturing procedure of the array substrate.

In the embodiments of the present invention, the material of the first touch sensing electrode 10 is not specially limited, for example, the first touch sensing electrodes 10 may be made of metal material Mo.

When the array substrate provided by the embodiments of the present invention is applied in a display panel, one of the first touch sensing electrodes 10 and the second touch sensing electrodes 20 is connected to a touch driving circuit, so that a touch driving signal is applied to said one of the first touch sensing electrodes 10 and the second touch sensing electrodes 20, and a touch sensing signal is applied to the other of the first touch sensing electrodes 10 and the second touch sensing electrodes 20; and an electrical signal of the touch driving signal is coupled to the other of the first touch sensing electrodes 10 and the second touch sensing electrodes 20 so as to form the touch sensing signal. The other of the first touch sensing electrode 10 and the second touch sensing electrode 20 may output the touch sensing signal to a touch controller, which may determine coordinates of a touch point according to the touch sensing signal.

To increase the storage capacitance of the array substrate, typically, as shown in FIG. 1, a common gate line 60 may be provided between every two adjacent gate lines 30, so that a common signal (the same as the signal provided to a common electrode) may be applied to the common gate line 60 in a display time. At least a part of the common gate line 60 corresponds to a drain 70 of the thin film transistor, so that a first storage capacitance is formed between the common gate line 60 and the drain 70 of the thin film transistor, a second storage capacitance is formed between and the common gate line 60 and the first touch sensing electrode 10. In addition, in the display time, a third storage capacitance may be formed between the common gate line 60 and a pixel electrode 80, thus increasing the overall storage capacitance of the array substrate. Therefore, in the array substrate provided by the embodiments of the present invention, the size of each pixel may be reduced, the PPI (Pixels per inch) of a touch display device including the array substrate is improved, and the probability that flicker and crosstalk occurs when a display panel including the array substrate displays can be reduced.

The working principle of the array substrate, provided by the embodiments of the present invention, used in a touch display device will be described below with reference to FIGS. 4a, 4b and 5a-5c.

Figure 4A:
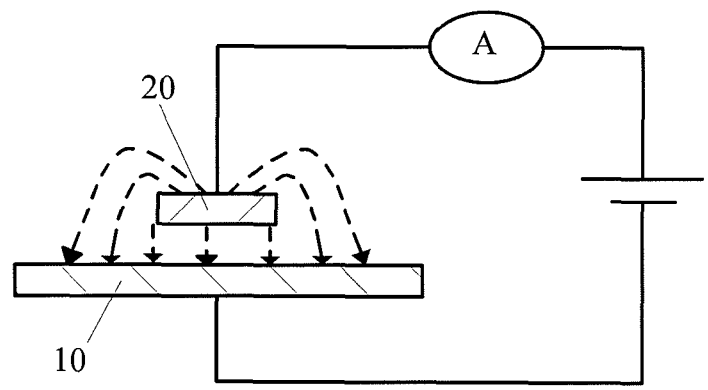
FIG. 4a is a diagram illustrating working principle of a touch display device provided by an embodiment of the present invention when no touch operation is performed.
Figure 4B:
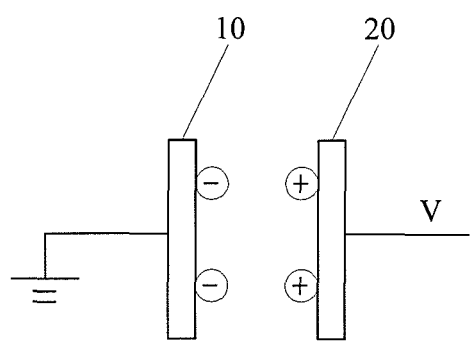
FIG. 4b is a diagram illustrating a capacitance state of a touch display device provided by an embodiment of the present invention when no touch operation is performed.

As shown in FIGS. 4a and 4b, when no touch operation is performed, the capacitance between the first touch sensing electrode 10 and the second touch sensing electrode 20 is in a static balance state, no touch sensing signal is generated, and the capacitance is C0.

Figure 5A:
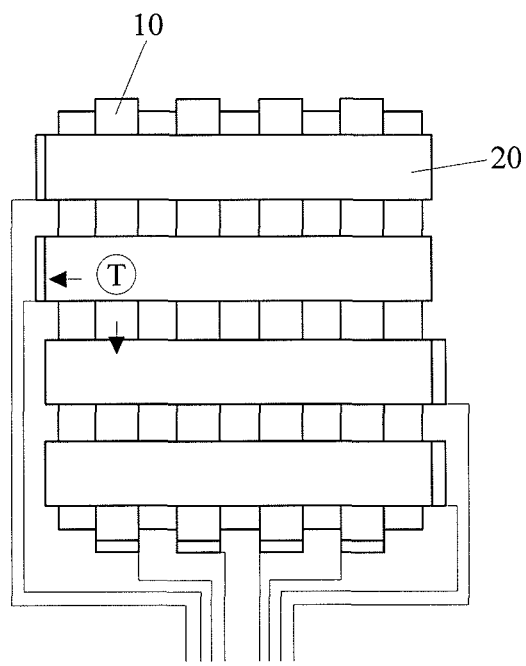
FIG. 5a is a schematic diagram illustrating a position of a touch point.
Figure 5B:
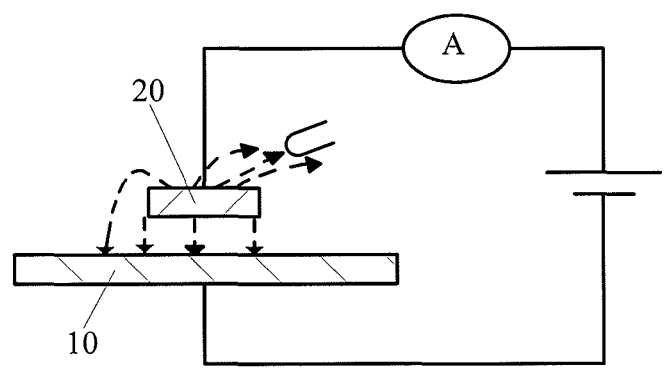
FIG. 5b is a diagram illustrating working principle of a touch display device provided by an embodiment of the present invention when a touch operation is performed.
Figure 5C:
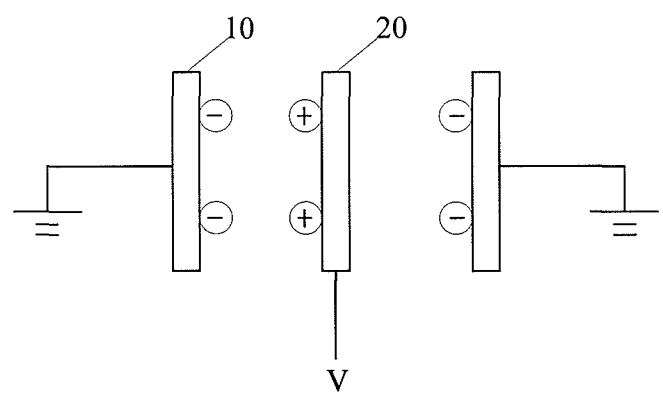
FIG. 5c is a diagram illustrating a capacitance state of a touch display device provided by an embodiment of the present invention when a touch operation is performed.

As shown in FIGS. 5a and 5b, when a touch operation is performed, that is, when a finger of an operator touches a point T of the display device, coupling capacitances are generated between the finger of the operator and the first and second touch sensing electrodes 10 and 20, respectively, so that the capacitance between the first touch sensing electrode 10 and the second touch sensing electrode 20 is changed. That is, as shown in FIG. 5c, the capacitance between the first touch sensing electrode 10 and the second touch sensing electrode 20 is changed from C0 to C0+ΔC. As a result, the position of a contact point can be determined according to the change of the output voltage signal due to coupling, thus achieving multi-point touch.

Those skilled in the art should understand that in each pixel unit, the gate of the thin film transistor is connected to the gate line, and the source of the thin film transistor is connected to the data line.

In the embodiments of the present invention, the type of the thin film transistors is not specifically limited. For example, the thin film transistors may be amorphous silicon thin film transistors (that is, the material of the active layers of the thin film transistors is amorphous silicon), or the thin film transistors are low-temperature polycrystalline silicon thin film transistors (that is, the material of the active layers of the thin film transistors includes low-temperature polycrystalline silicon).

A low-temperature polycrystalline silicon thin film transistor has the following advantages: 1) greatly improved mobility of carriers; 2) relatively high aperture ratio; and 3) quick response speed and small area. As users have higher and higher requirements on display quality, more and more array substrates use low-temperature polycrystalline silicon thin film transistors. When the thin film transistors are low-temperature polycrystalline silicon thin film transistors, in order to prevent metal ions from entering the active layers of the thin film transistors due to a subsequent high-temperature process, for example, referring to FIG. 1, the array substrate may further include a buffer layer 50, the active layers 40 of the thin film transistors are provided on the upper surface of the buffer layer 50, and the first touch sensing electrodes 10 are provided on the lower surface of the buffer layer 50. To form capacitances together with the first touch sensing electrodes 10, the second touch sensing electrodes 20 may be provided above the buffer layer 50. The words of locality such as "above and below" used herein refer to "up and down" directions in FIG. 1.

It should be understood that the buffer layer 50 covers the whole substrate (not shown) of the array substrate. The first touch sensing electrodes 10 may be directly provided on the substrate of the array substrate.

In order to avoid the interference between signals of two adjacent first touch sensing electrodes 10, for example, a first floating electrode 11 may be provided between two adjacent first touch sensing electrodes 10, as shown in FIG. 2. The first floating electrode 11 may float all the time, or float only in the display time, which will be explained hereinafter and is not repeated here. It should be understood that the word "float" used herein means no access to any electrical signal.

Figure 3:
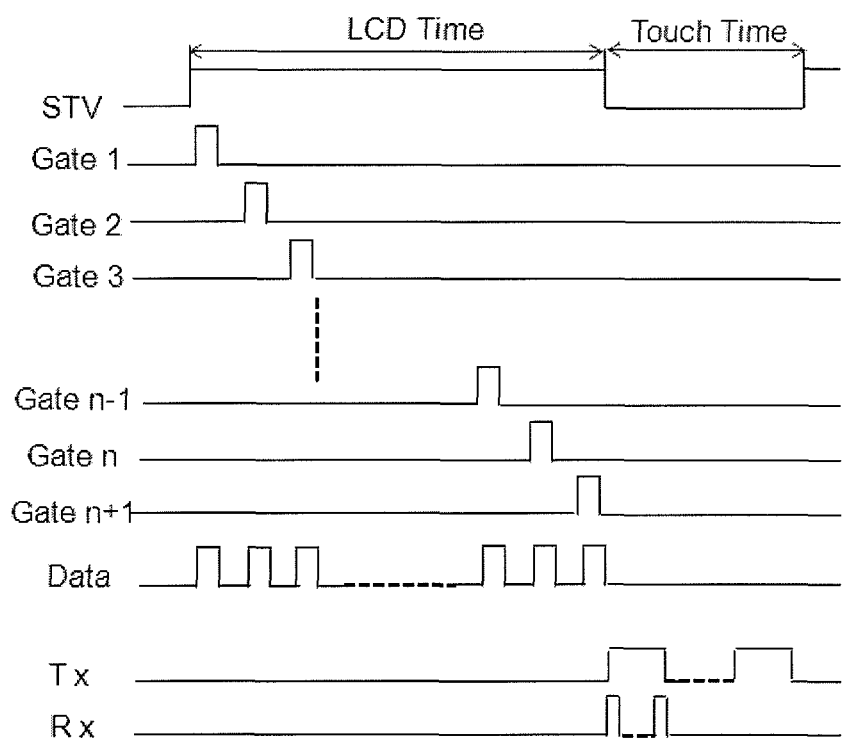
FIG. 3 is a timing diagram for time-sharingly driving a touch panel provided by an embodiment of the present invention.

In the embodiments of the present invention, the specific form of the second touch sensing electrodes 20 is not specifically limited, as long as capacitances can be formed at the intersections of the first touch sensing electrodes 10 and the second touch sensing electrodes 20. To further reduce the thickness of the array substrate and further simplify the manufacturing procedures of the array substrate, for example, the second touch sensing electrodes 20 may be shared as the common electrodes of the array substrate, that is, the second touch sensing electrodes 20 may also serve as the common electrodes of the array substrate. In this case, a timing signal for controlling the display panel may be divided into a display time (LCD Time) and a touch time (Touch Time), as shown in FIG. 3. During the display time, a common signal Vcom may be applied to the second touch sensing electrodes 20, that is, the second touch sensing electrodes 20 serve as common electrodes of the array substrate; and during the touch time, applying the common signal Vcom to the second touch sensing electrodes 20 is stopped, and the voltage signal of the touch driving signal is coupled to the second touch sensing electrodes 20 and the coupled signal is output by the second touch sensing electrodes 20.

It should be easily understood that, as the duration of one frame of image is very short, both the duration of a gray-scale signal and the duration of a touch driving signal are very short in the whole display process (for example, the duration of the gray-scale signal may be 0.05 s, and the duration of the touch driving signal may be 0.01 s). Therefore, in the embodiments of the present invention, the sharing of the second touch sensing electrodes 20 and the common electrodes of the array substrate does not influence the display effect and the touch operation effect.

In order to avoid the interference between signals of two adjacent second touch sensing electrodes 20, for example, as shown in FIG. 2, a second floating electrode 22 may be provided between every two adjacent second touch sensing electrodes 20. The second floating electrode 22 and the second touch sensing electrodes 20 are located in the same layer, and the second floating electrode and the second touch sensing electrodes 20 may be formed in the same patterning process. In the embodiments of the present invention, the second floating electrode 22 may float all the time, or only float in the display time, which will be described hereinafter and not repeated here.

To further increase the storage capacitance of the array substrate, for example, in each pixel unit, the active layer 40 of the thin film transistor is connected to the corresponding first touch sensing electrode 10 through a first via hole. Specifically, after the buffer layer 50 is formed, the first via hole penetrating through the buffer layer 50 is formed in the buffer layer, and when depositing a material film layer forming the active layer, the material of the active layer is deposited to fill the first via holes so as to form a first electrode 41, which connects the active layer 40 to the first touch sensing electrode 10.

Referring to FIG. 1, the gate lines 30 and the common gate lines 60 are in the same metal layer, a gate scanning signal may be applied to the gate lines 30, and a common signal may be applied to the common gate lines 60, so that the first storage capacitances are formed between the common gate lines 60 and the drains 70, thereby increasing storage capacitance. Meanwhile, since the active layers 40 are connected to the respective first touch sensing electrodes 10 therebelow, the second storage capacitance is also formed between the first touch sensing electrode 10 located on the right side in FIG. 1 and the common gate line 60, so that the effect of increasing storage capacitance is further achieved. With such a structure arrangement, in each pixel unit, the first touch sensing electrode 10 on the left side may receive a sensing signal, and the first touch sensing electrode 10 on the right side may be applied with the common signal, so that the effects of removing shadow and avoiding interference are achieved.

During the display time, the thin film transistors are turned on by the gates thereof, so that the active layers 40 may be conductive, and conductive paths are formed between the sources and drains of the thin film transistors.

Meanwhile, capacitances may be formed between the first touch sensing electrodes 10 and the common gate lines 60, so that the overall storage capacitance of the array substrate is further increased, thus the size of each pixel unit may be further reduced, the PPI of the display panel is further increased, and the display quality of the display panel is improved.

As a specific implementation of the present invention, as shown in FIG. 1, the array substrate further includes a gate insulating layer 42, an intermediate insulating layer 31, a planarization layer 72 and a passivation layer 21. The gate insulating layer 42 covers the active layers 40 of the thin film transistors, and the gate lines 30 and the common gate lines 60 are provided on the upper surface of the gate insulating layer 42. The intermediate insulating layer 31 covers the gate lines 30 and the common gate lines 60, and the sources (not shown) and drains 70 of the thin film transistors are provided on the upper surface of the intermediate insulating layer 31. The planarization layer 72 covers the sources and drains 70 of the thin film transistors, and the second touch sensing electrodes 20 are provided on the planarization layer 72. The passivation layer 21 covers the second touch sensing electrodes 20, and the pixel electrodes 80 are provided on the upper surface of the passivation layer 21. Both of the sources (not shown) and drains 70 of the thin film transistors are connected to the active layers 40 of the respective thin film transistors through second via holes (specifically, through second electrodes 71 formed by filling the second via holes) penetrating through the intermediate insulating layer 31 and the gate insulating layer 42. The pixel electrodes 80 are connected to the drains 70 of the respective thin film transistors through third via holes (specifically, through third electrodes 81 formed by filling the third via holes) penetrating through the passivation layer 21 and the planarization layer 72. It should be easily understood that the material of the second electrodes 71 may be the same as that of the drains 70 of the thin film transistors, and the material of the third electrodes 81 may be the same as that of the pixel electrodes 80.

It should be easily understood that the words of locality "on and below" used herein refer to "up and down" directions in FIG. 1.

As a specific implementation of the present invention, the first touch sensing electrodes 10 may be formed to be touch detecting electrodes, while the second touch sensing electrodes 20 may be formed to be touch driving electrodes. That is, a touch driving signal may be applied to the second touch sensing electrode 20, when a touch occurs, the touch driving signal is coupled to the first touch sensing electrodes 10 to form a sensing signal, and the first touch sensing electrodes 10 are connected to a touch control circuit to output the sensing signal to the touch control circuit, and the touch control circuit determines coordinates of a touch point according to the position sensing signal.

Of course, the first touch sensing electrodes 10 may also be connected to a touch driving circuit, so that a touch sensing signal is provided to the first touch sensing electrodes 10 by the touch driving circuit. When a touch operation is performed, a current of the first touch sensing electrodes 10 is changed, thus a position sensing signal is generated, and the touch control circuit determines the position of the touch point according to the position sensing signal.

As another aspect of the embodiments of the present invention, there is provided a touch display device, comprising an array substrate, a touch driving circuit and a touch control circuit, the array substrate is the above array substrate provided by the embodiment of the present invention, the first touch sensing electrodes 10 and the second touch sensing electrodes 20 are connected to the touch driving circuit and the touch control circuit, respectively; the touch driving circuit provides a touch driving signal to one of the first touch sensing electrodes 10 and the second touch sensing electrodes 20, and when a touch operation is performed, the touch driving signal is coupled to the other of the first touch sensing electrodes 10 and the second touch sensing electrodes 20 to generate a position sensing signal and outputs the position sensing signal to the touch control circuit.

One of the first touch sensing electrodes 10 and the second touch sensing electrodes 20 are connected to the touch driving circuit, which provides a touch driving signal to the one of the first touch sensing electrodes 10 and the second touch sensing electrodes 20 connected thereto.

The other of the first touch sensing electrodes 10 and the second touch sensing electrodes 20 are connected to the touch control circuit. When a touch operation is performed, the other of the first touch sensing electrodes 10 and the second touch sensing electrodes 20 couple the touch driving signal to generate a position sensing signal and output the position sensing signal to the touch control circuit.

As the array substrate has a relatively simple structure, relatively small thickness and relatively simple manufacturing method, the touch display device provided by the embodiments of the present invention also has a relatively simple structure, relatively small thickness and relatively simple manufacturing method.

It should be easily understood that the display panel provided by the embodiments of the present invention may further include a color filter substrate arranged opposite to the array substrate and a liquid crystal layer arranged between the color filter substrate and the array substrate.

In the embodiments of the present invention, different driving circuits may be employed to control the touch display device to perform display and touch operations, respectively. That is, the touch display device may further include a display driving circuit. The gate lines and the data lines are connected to the display driving circuit, respectively. In a display time, the display driving circuit outputs a scanning signal to the gate lines, and outputs a gray-scale signal to the data lines. The manner in which the touch driving circuit is connected to the first touch sensing electrodes and the second touch sensing electrodes has been described above in details and will not be repeated here.

Furthermore, in the touch display panel provided by the embodiments of the present invention, time-sharing driving manner is used in the touch time and the display time, so that the mutual interference between the display signal and the touch driving signal can be avoided, and the quality of displayed pictures and the accuracy of touch are ensured. Specifically, FIG. 3 is a timing diagram of time-sharingly driving the touch display panel provided by the embodiments of the present invention. The time in which the touch panel displays one frame may be divided into a display time (LCD time) and a touch time (Touch Time), and an STV signal is a starting signal for one frame of image. As shown in FIG. 3, in the time for displaying one frame, the length of the LCD time and the length of the touch time may be allocated specifically according to resolutions of different products, and will not be specifically limited herein. In the touch time, the touch driving circuit applies a touch driving signal Tx to the first touch sensing electrodes 10 to apply a touch sensing signal Rx to the second touch sensing electrodes 20. When a touch operation is performed, the capacitances between the first touch sensing electrodes 10 and the second touch sensing electrodes 20 are changed, a position sensing signal is generated on the second touch sensing electrodes 20, and the position sensing signal is transmitted to the touch control circuit, which determines the coordinates of the position of the touch point according to the position sensing signal. Alternatively, the touch driving signal applies a touch driving signal Tx to the second touch sensing electrodes 20 to apply a touch sensing signal Rx to the first touch sensing electrodes 10, and the first touch sensing electrodes 10 are connected to the touch control circuit, thus the coordinates of the position of the touch point are determined according to the position sensing signal output by the first touch sensing electrodes 10. In the LCD time, a scanning signal is sequentially applied to the respective gate lines Gate1, Gate2 . . . Gate n+1 in the touch panel, and a gray-scale signal is applied to the data lines Data, so that the display function is realized.

In the case where the array substrate includes common gate lines, the common gate lines are connected to the touch driving circuit, and the touch driving circuit provides common signals Vcom to the common gate lines in the LCD time.

In the case where the array substrate includes a first floating electrode arranged between every two adjacent first touch sensing electrodes, the first floating electrodes are connected to the touch driving circuit, and in the touch time, the touch driving circuit outputs an electrical signal (different from the touch driving signal) identical to the common signal Vcom to the first floating electrodes, to avoid the mutual interference between the signals of adjacent first touch sensing electrodes; and in the LCD time, the first floating electrodes are set to float (that is, the touch driving circuit does not provide any signal to the first floating electrodes) to form capacitances together with the gates, so that the overall storage capacitance of the array substrate can be increased.

In the case where the array substrate includes a second floating electrode arranged between every two adjacent second touch sensing electrodes, the second floating electrodes are connected to the touch driving circuit, and in the touch time, the touch driving circuit outputs an electrical signal (different from the touch driving signal) identical to the common signal Vcom to the second floating electrodes, to avoid the mutual interference between the signals of adjacent second touch sensing electrodes; and in the LCD time, the second floating electrodes are set to float to form capacitances together with the pixel electrodes, so that the overall storage capacitance of the array substrate can be increased, thus the size of each pixel can be reduced, and the PPI of the touch display device is further improved.

As another aspect of the embodiments of the present invention, a manufacturing method of the above array substrate is provided. Accordingly, the array substrate includes a plurality of data lines, a plurality of gate lines and a plurality of thin film transistors. The plurality of data lines and the plurality of gate lines intersect with each other in different planes to divide the array substrate into a plurality of pixel units, and the thin film transistor is provided in each pixel unit. Accordingly, the manufacturing method includes the following steps of:

forming a first set of patterns, the first set of patterns including first touch sensing electrodes;

forming a second set of patterns, the second set of patterns including active layers of thin film transistors, the active regions of the active layers being located above the first touch sensing electrodes so that the first touch sensing electrodes also serve as metal shielding layers for blocking light emitted by a backlight source;

forming a third set of patterns, the third group of patterns including the gate lines and gates of the thin film transistors;

forming a fourth set of patterns, the fourth set of patterns including data lines and sources and drains of the thin film transistors; and forming a fifth set of patterns, the fifth set of patterns including second touch sensing electrodes, the second touch sensing electrodes and the first touch sensing electrodes intersecting with each other in different planes, capacitances being formed at intersections of the first touch sensing electrodes and the second touch sensing electrodes.

It should be easily understood that the sequence in which the above steps are performed is not strictly defined in the embodiments of the present invention.

The first set of patterns to the fifth set of patterns may be formed by using various patterning processes. For example, the first set of patterns to the fifth set of patterns may be formed by printing, transfer printing or other method, and may also be formed by a traditional lithographic patterning process. The formation of the first set of patterns is taken as an example, a film layer may be first formed on a substrate (by coating, sputtering or other process), then a photoresist is coated on the film layer, and subsequently exposure, development, etching, photoresist stripping and other processes are performed to form the first set of patterns. The processes of forming other sets of patterns are similar to the process of forming the second set of patterns and will not be repeated here.

In an implementation in which common gate lines are included, the third set of patterns further includes a common gate line located between every two adjacent gate lines, the common gate line is used for receiving a common signal, and at least a part of the common gate line is located to correspond to the drain of the thin film transistor and the first touch sensing electrode, so that a first storage capacitance is formed between the common gate line and the drain of the thin film transistor, and a second storage capacitance is formed between the common gate line and the first touch sensing electrode.

As described above, the material of the active layers of the thin film transistors may be low-temperature polycrystalline silicon. That is, the material for forming the second set of patterns includes low-temperature polycrystalline silicon. In this case, the manufacturing method further includes a step of forming a buffer layer between the step of forming a first set of patterns and the step of forming a second set of patterns, so that the first touch sensing electrodes are provided on the lower surface of the buffer layer, and the active layers of the thin film transistors are provided on the upper surface of the buffer layer.

As described above, the active layers are connected to the first touch sensing electrodes through the first via holes, and therefore, the manufacturing method further includes, between the step of forming a first set of patterns and the step of forming a second set of patterns, a step of forming first via holes; and in the step of forming a second set of patterns, the first via holes are filled, so as to form first electrodes provided in the first via holes, so that the active layers are connected to the first touch sensing electrodes through the first via holes.

As an implementation of the present invention, the first set of patterns further includes a first floating electrode between every two adjacent first touch sensing electrodes.

Also, as another implementation of the present invention, the second touch sensing electrodes also serve as common electrodes of the array substrate.

Similar to the first floating electrodes, the fifth set of patterns further includes a second floating electrode between every two adjacent second touch sensing electrodes.

In the process of specifically forming the array substrate as shown in FIG. 1, the manufacturing method further includes steps of:

forming a gate insulating layer between the step of forming a second set of patterns and the step of forming a third set of patterns, so that the gate lines and the common gate lines are provided on the upper surface of the gate insulating layer;

forming an intermediate insulating layer and second via holes penetrating through the gate insulating layer and the intermediate insulating layer between the step of forming a third set of patterns and the step of forming a fourth set of patterns, so that the sources and drains of the thin film transistors are located on the upper surface of the intermediate insulating layer, and the sources and drains of the thin film transistors are connected to the active layers through the second via holes;

forming a planarization layer between the step of forming a fourth set of patterns and the step of forming a fifth set of patterns, so that the planarization layer covers the sources and drains of the thin film transistors, and the second touch sensing electrodes are provided above the planarization layer;

forming a passivation layer after the step of forming a fifth set of patterns, so that the passivation layer covers the common electrodes;

forming third via holes penetrating through the passivation layer; and forming patterns including pixel electrodes, so that the pixel electrodes are connected to the drains of the respective thin film transistors through the third via holes.

It should be understood that the above implementations are merely exemplary embodiments used for describing the principle of the present invention, but the embodiments of the present invention are not limited thereto. Various variations and improvements can be made by those skilled in the art without departing from the spirit and essence of the present invention, and these variations and improvements should also be considered to be within the protection scope of the present invention.

The invention claimed is:

1. An array substrate, comprising a plurality of data lines, a plurality of gate lines and a plurality of thin film transistors, the plurality of data lines and the plurality of gate lines intersecting with each other in different planes to divide the array substrate into a plurality of pixel units, the thin film transistor being provided in each pixel unit, wherein the array substrate further comprises a plurality of first touch sensing electrodes and a plurality of second touch sensing electrodes, wherein the first touch sensing electrodes are provided below active regions of active layers of the thin film transistors, and the first touch sensing electrodes also serve as metal shielding layers for blocking light emitted from a backlight source, the first touch sensing electrodes and the second touch sensing electrodes intersect with each other in different planes, and capacitances are formed at intersections of the first touch sensing electrodes and the second touch sensing electrodes, a common gate line for receiving a common signal is provided between every two adjacent gate lines, at least a part of the common gate line is located to correspond to a drain of the thin film transistor and the first touch sensing electrode, so that a first storage capacitance is formed between the common gate line and the drain of the thin film transistor, and that a second storage capacitance is formed between the common gate line and the first touch sensing electrode, the array substrate further comprises a gate insulating layer and an intermediate insulating layer, the gate insulating layer covers the active layers of the thin film transistors, and the gate lines and the common gate lines are provided on an upper surface of the gate insulating layer, and the intermediate insulating layer covers the gate lines and the common gate lines, and sources and drains of the thin film transistors are provided on an upper surface of the intermediate insulating layer.

2. The array substrate according to claim 1, wherein material of the active layers of the thin film transistors comprises low-temperature polycrystalline silicon; and the array substrate further comprises a buffer layer, the active layers of the thin film transistors are provided on an upper surface of the buffer layer, the first touch sensing electrodes are provided on a lower surface of the buffer layer, and the second touch sensing electrodes are provided above the buffer layer.

3. The array substrate according to claim 2, wherein in each of the pixel units, the active layer of the thin film transistor is connected to the corresponding first touch sensing electrode through a first via hole penetrating through the buffer layer.

4. The array substrate according to claim 1, further comprising a planarization layer and a passivation layer, wherein:

the planarization layer covers the sources and drains of the thin film transistors, and the second touch sensing electrodes are provided above the planarization layer;

the passivation layer covers the common electrodes, and pixel electrodes of the array substrate are provided on an upper surface of the passivation layer; and both the sources and drains of the thin film transistors are connected to the active layers of the thin film transistors through second via holes penetrating through the intermediate insulating layer and the gate insulating layer, and the pixel electrodes are connected to the drains of the thin film transistors through third via holes penetrating through the passivation layer and the planarization layer.

5. The array substrate according to claim 1, wherein the first touch sensing electrodes are touch detecting electrodes, while the second touch sensing electrodes are touch driving electrodes.

6. The array substrate according to claim 1, wherein a first floating electrode is provided between every two adjacent first touch sensing electrodes.

7. The array substrate according to claim 1, wherein the second touch sensing electrodes also serve as common electrodes of the array substrate.

8. The array substrate according to claim 1, wherein a second floating electrode is provided between every two adjacent second touch sensing electrodes.

9. A touch display device, comprising an array substrate, a touch driving circuit and a touch control circuit, wherein the array substrate is the array substrate according to claim 1, wherein the first touch sensing electrodes and the second touch sensing electrodes are connected to the touch driving circuit and the touch control circuit, respectively, the touch driving circuit is configured to provide a touch driving signal to one of the first touch sensing electrodes and the second touch sensing electrodes in a touch time, and when a touch operation is performed, the touch driving signal is coupled to the other of the first touch sensing electrodes and the second touch sensing electrodes to form a position sensing signal, and the position sensing signal is output to the touch control circuit.

10. The touch display device according to claim 9, wherein the touch display device further comprises a display driving circuit, the gate lines and the data lines are connected to the display driving circuit, respectively, wherein the display driving circuit is configured to output a scanning signal to the gate lines and provide a gray scale signal to the data lines in a display time.

11. The touch display device according to claim 10, wherein a first floating electrode connected to the touch driving circuit is provided between every two adjacent first touch sensing electrodes, wherein, in the touch time, the touch driving circuit outputs an electrical signal same as a common signal to the first floating electrode; and in the display time, the first floating electrode is set to float.

12. The touch display device according to claim 10, wherein a second floating electrode connected to the touch driving circuit is provided between every two adjacent second touch sensing electrodes, wherein, in the touch time, the touch driving circuit outputs an electrical signal same as the common signal to the second floating electrode; and in the display time, the second floating electrode is set to float.

\* \* \* \* \*